United States Patent [19]

Jackson

[11] Patent Number: 5,236,602

[45] Date of Patent: Aug. 17, 1993

[54] DENSE FLUID PHOTOCHEMICAL PROCESS FOR LIQUID SUBSTRATE TREATMENT

[75] Inventor: David P. Jackson, Saugus, Calif.

[73] Assignee: Hughes Aircraft Company, Los Angeles, Calif.

[21] Appl. No.: 646,129

[22] Filed: Jan. 28, 1991

Related U.S. Application Data

[62] Division of Ser. No. 332,124, Apr. 3, 1989.

[51] Int. Cl.$^5$ .................... C02F 1/32; C02F 1/78
[52] U.S. Cl. .................... 210/748; 210/760; 210/761; 210/908
[58] Field of Search ............... 210/748, 760, 761, 908, 210/909; 134/1, 2, 31, 35, 37, 42

[56] References Cited

U.S. PATENT DOCUMENTS 4,347,144 8/1982 Bodenbenner et al. ............ 210/761
4,543,190 9/1985 Modell ............................... 210/761
4,654,144 3/1987 Sharkey et al. .................... 210/761
4,751,005 6/1988 Mitsui et al. ....................... 210/760
4,849,114 7/1989 Zeff et al. .......................... 210/760
4,956,098 9/1990 Stevens et al. ..................... 210/760

Primary Examiner—Thomas Wyse
Attorney, Agent, or Firm—M. E. Lachman; M. W. Sales; W. K. Denson-Low

[57] ABSTRACT

A process for removing undesired material from a chosen substrate by exposing the substrate simultaneously to ultraviolet radiation and a selected dense fluid, wherein the radiation produces a photochemical reaction that removes the undesired material from the substrate and the dense fluid enhances the removal of the undesired material. In an alternative embodiment, a reactive agent may additionally be used. The process may be used to remove contaminants from a substrate, etch a substrate surface, or destroy toxic organic material in industrial wastes.

13 Claims, 1 Drawing Sheet

U.S. Patent  Aug. 17, 1993  5,236,602
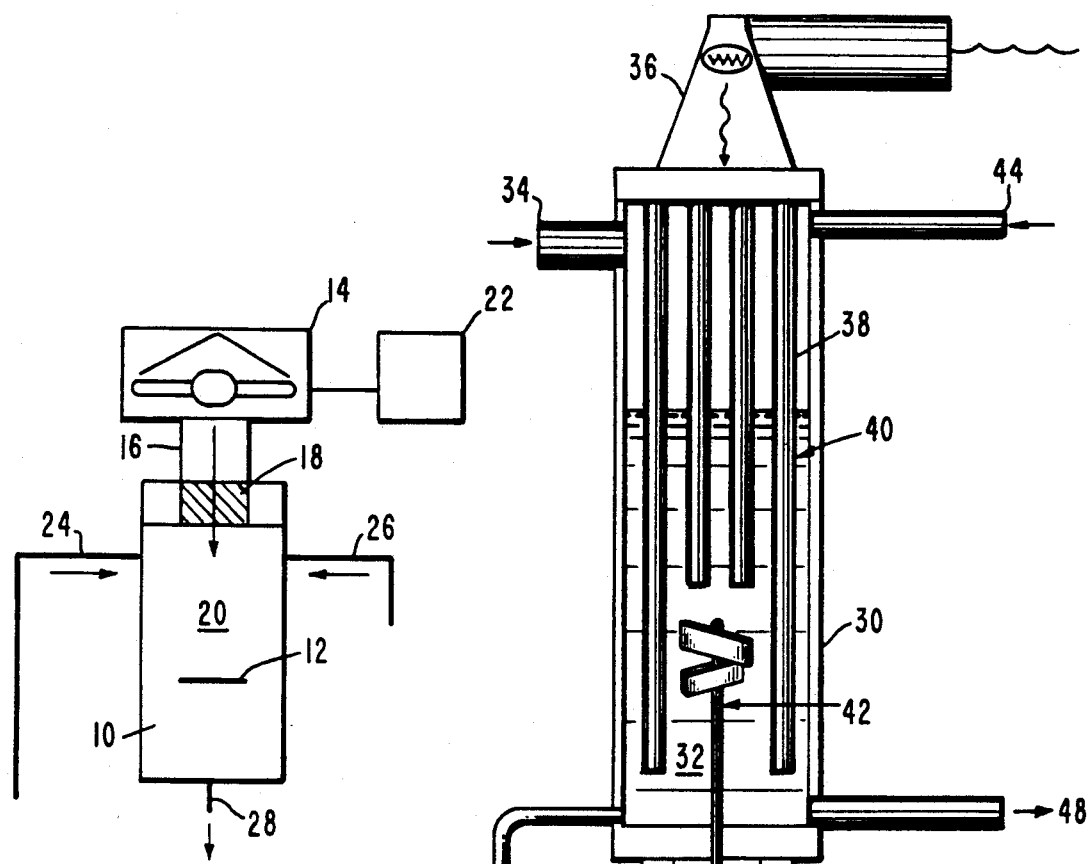
Fig. 1.
Fig. 2.
Fig. 3.
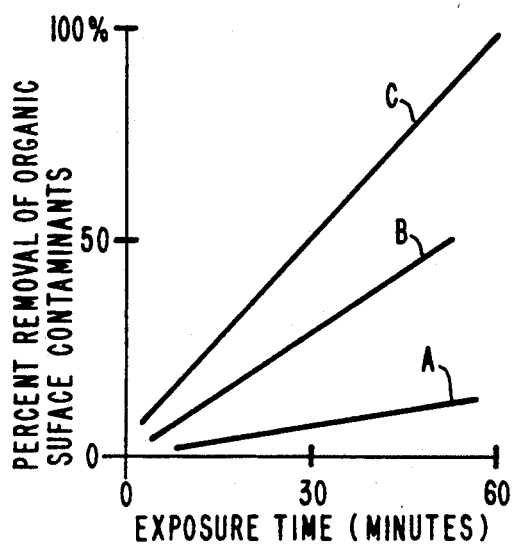

DENSE FLUID PHOTOCHEMICAL PROCESS FOR LIQUID SUBSTRATE TREATMENT

This is a division of application Ser. No. 07/332,124 filed Apr. 3, 1989.

BACKGROUND OF THE INVENTION

1. Field of the Invention

The present invention relates generally to a process for treating a substrate in order to remove undesired material therefrom by exposing the substrate simultaneously to radiation and a dense fluid. More particularly, the present invention relates to methods for removing contaminants from a substrate, for etching a substrate surface, and for detoxifying or decontaminating industrial waste materials.

2. Description of Related Art

In the fabrication of various electronic and optical devices, the surface of the devices often become contaminated with undesired materials, such as organic or inorganic materials, which must be subsequently removed. In addition, in the fabrication of such devices, it is sometimes desirable to etch the surface of the device prior to subjecting it to further processing, such as oxide layer deposition or patterned metal layer formation.

As is known in the art of decontamination, ultraviolet radiation, particularly radiation at 253.7 nanometers (nm) and 184.9 nm, is absorbed by contaminant hydrocarbons and causes dissociation thereof. The fragments produced by this dissociation absorb additional ultraviolet radiation and are further dissociated. Complete dissociation results in the formation of water, carbon dioxide, or nitrogen. Ultraviolet radiation has been used to decompose organic contaminants in water and waste water, as disclosed, for example, in the publication entitled "Investigation into Chemistry of the UV-Ozone Purification Process" by E. Leitis, Jan. 31, 1979, Report No. NSF/RA 790038, National Technical Information Service Accession No. PB 296485. However, organic wastes, either solid or liquid, are not usually miscible with water and cannot be treated by standard UV treatment methods. In such cases, the organic wastes are usually incinerated or buried in a landfill. In addition, this type of photolysis process has been used in combination with oxidation processes to remove organic contaminants from a variety of substrates. Ultraviolet/ozone cleaning has been used to remove organic contaminants from surfaces such as glass, quartz, mica, ceramics, and metals, as described, for example, by L. Zafonte and R. Chiu, in the publication entitled "UV/Ozone Cleaning For Organics Removal on Silicon Wafers," Paper No. 470-19, Proceedings of the SPIE 1984 Microlithography Conference, Mar. 11-16, 1984, Santa Clara, Calif. In such a process, two wavelengths of radiation are used 253.7 nanometers and 184.9 nm. The 253.7 nm radiation is absorbed by the contaminant hydrocarbons and produces bond scission. The resulting fragments are further dissociated by additional exposure to the 253.7 nm radiation, and the final products of this dissociation are water, carbon dioxide, or nitrogen. Concurrently, the 184.9 nm radiation is absorbed by molecular oxygen present in the air environment and dissociates the latter to produce atomic oxygen. The atomic oxygen then combines with additional molecular oxygen present in the environment to form ozone ($O_3$). The ozone oxidizes the hydrocarbon contaminants to produce carbon dioxide and water as the final products. The ozone also absorbs 253.7 nm radiation and is dissociated into molecular oxygen and atomic oxygen. The latter two species recombine to form ozone. Thus, ozone is continually formed and dissociated.

These conventional ultraviolet/ozone processes for cleaning substrate surfaces have several disadvantages. In order for the ultraviolet/ozone process to be effective, it is essential that the substrate be properly precleaned to remove gross contaminants. The precleaning steps generally use polar and nonpolar solvents, followed by an ultrapure water rinse. The polar solvents remove ionic or inorganic contamination which may not be removed by the ultraviolet/ozone step; and the nonpolar solvents remove all gross organic contaminants. In addition, since the conventional ultraviolet/ozone cleaning process is designed to remove monolayer surface contaminants, the process is presently limited to decontamination of minute levels of hydrocarbons. Any gross inorganic or ionic contaminants which were not removed during the precleaning operations will not be removed by the photosensitized oxidation which occurs during ultraviolet/ozone exposure. Further, all gross hydrocarbon contamination must be removed in a precleaning step since the exposure of gross hydrocarbon contamination to ultraviolet radiation will result in cross-linking and charring. Such polymerization and charring products create a shield for buried layers of contaminants and terminate the cleaning process.

Other problems with the conventional ultraviolet/ozone cleaning are that the process is performed in a gaseous environment at atmospheric pressure or reduced pressure, is based solely on photodegradation, and limited ozone contact, and does not include solvation and fluid transfer mechanisms. The previously described oxidation process occurs in a gaseous environment, which is non-intimate and difficult to stabilize. The previously described dissociation of contaminants takes place only on the surface. In addition, only contaminant by-products which are gaseous are removed. Finally, the conventional ultraviolet/ozone cleaning process is limited in that the surfaces to be cleaned must be in line of sight to the ultraviolet light source for effective photochemical degradation. Thus, surfaces with cavities and holes or surfaces located beneath surface mounted components cannot be effectively cleaned.

Another type of cleaning system involves the use of dense phase gases as a replacement for conventional organic solvents. A dense phase gas is a gas compressed under either supercritical or subcritical conditions to liquid-like densities. These dense gases are referred to as dense fluids. Unlike organic solvents, such as n-hexane, or 1,1,1-trichloroethane, dense phase gas solvents exhibit unique physical and chemical properties such as low surface tension, low viscosity, and variable solute carrying capacity.

The solvent properties of compressed gases is well known. In the late 1800's, Hannay and Hogarth found that inorganic salts could be dissolved in supercritical ethanol and ether (J. B. Hannay and H. Hogarth, *J.Proc Roy.Soc.* (London), 29, p. 324, 1897). By the early 1900's, Buchner discovered that the solubility of organics such as naphthalene and phenols in supercritical carbon dioxide increased with pressure (E. A. Buchner, *Z.Physik Chem.*, 54, p. 665, 1906). Within forty years Francis had established a large solubility database for liquified carbon dioxide which showed that many organic compounds were completely miscible (A. W. Francis, *J.Phys.Chem.*, 58, p. 1099, 1954).

In the 1960's there was much research and use of dense gases in the area of chromatography. Supercritical fluids (SCFs) were used as the mobile phase in separating non-volatile chemicals (S. R. Springston and M. Novotny, "Kinetic Optimization of Capillary Supercritical Chromatography using Carbon Dioxide as the Mobile Phase", *CHROMATOGRAPHIA*, Vol. 14, No. 12, p. 679, December 1981).

Documented industrial applications utilizing dense fluid cleaning include extraction of oil from soybeans (J. P. Friedrich and G. R. List and A. J. Heakin, "Petroleum Free Extracts of Oil from Soybeans", *JAOCS*, Vol. 59, No. 7, July 1982), decaffination of coffee of pyridines from coal (T. G. Squires, et al, "Supercritical Solvents. Carbon Dioxide Extraction of Retained Pyridine from Pyridine Extracts of Coal", *FUEL*, Vol. 61, November 1982), extraction of flavorants from hops (R. Vollbrecht, "Extraction of Hops with Supercritical Carbon Dioxide", *Chemistry and Industry*, 19 June 1982), and regeneration of absorbents (activated carbon) (M. Modell, "Process for Regenerating Absorbents with Supercritical Fluids", U.S. Pat. No. 4,124,528, 7 November 1978).

As the complexity of manufactured devices and structures increases and cleanliness requirements for such devices and structures increase, more effective and more efficient cleaning methods are required. Electro optical devices, lasers and spacecraft assemblies are fabricated from many different types of materials having various internal and external geometrical structures which are generally contaminated with more than one type of contamination. (These highly complex and delicate assemblies can be classified together as "complex hardware".) Consequently, there is a continuing need to provide improved cleaning processes in which both gross and precision cleaning are simultaneously accomplished.

With regard to surface preparation, such as in the fabrication of electronic devices, known methods include both chemical and physical means for removing the surface layer from the substrate prior to deposition. Such methods include, for example, wet chemical etching with aqueous or non-aqueous materials, plasma etching, or ultrasonics. Each of these methods has the disadvantages that it requires expensive equipment, uses solvents, and must be performed as a separate processing step. Thus, there is a continuing need to provide improved methods for substrate surface preparation prior to deposition of a material on the substrate.

With regard to the treatment of industrial waste materials, known methods for treating solid hazardous organic wastes include thermal decomposition, pyrolysis, or UV-peroxidation. These methods have the disadvantage that they require burning, reaction, or stabilization of the solid waste prior to disposal. Thus, there is a continuing need to provide improved methods for the treatment of industrial waste materials to remove or destroy unwanted solid organic or inorganic materials, particularly toxic materials.

SUMMARY OF THE INVENTION

The general purpose of the present invention is to provide a new and improved method for removing undesired material from a chosen substrate This process possesses all of the advantages of the above prior art processes while overcoming most of their significant disadvantages.

The above general purpose of this invention is accomplished by first placing the substrate containing the undesired material in a cleaning vessel. The contaminated substrate is contacted with a chosen dense fluid and simultaneously with radiation of a predetermined wavelength. The radiation induces a photochemical reaction which removes the undesired material from the substrate and the dense fluid enhances this removal of the undesired material.

In accordance with one embodiment of the present invention, a contaminant is removed from the surface of a substrate. In accordance with a second embodiment of this invention, a portion of the substrate surface is removed in an etching process. In accordance with a third embodiment of this invention, organic contaminants are removed from industrial waste materials. In accordance with an alternative embodiment of the present invention, a dense phase oxidant is used to enhance the removal of the undesired material.

These and many other features and attendant advantages of the present invention will become apparent as the invention becomes better understood by reference to the following detailed description when considered in conjunction with the accompanying drawings.

BRIEF DESCRIPTION OF THE DRAWINGS

FIG. 1 is a schematic representation of a system for practising a preferred exemplary process of the present invention in which the dense fluid comprises a compressed gas.

FIG. 2 is a schematic representation of a system for practising an exemplary alternative embodiment of the present invention in which the substrate comprises slurried solid industrial waste containing organic contaminants.

FIG. 3 presents a graph comparing the percent of surface organic contaminants removed by the process of the present invention, by a conventional ultraviolet-/ozone process, and by a conventional dense fluid cleaning process.

DETAILED DESCRIPTION OF THE INVENTION

In accordance with the process of the present invention, a substrate containing an undesired material, such as organic contaminants, is exposed simultaneously to a selected dense fluid and radiation of a selected wavelength. The dense fluids suitable for use in the present process comprise either supercritical or liquified gases, or inorganic liquids at standard temperature and pressure (STP). Suitable gases include any of the known gases which may be converted to supercritical fluids or liquified at temperatures and pressures which will not degrade the physical or chemical properties of the substrate being cleaned, if the latter is of concern, such as for delicate aerospace hardware. On the other hand, if the substrate comprises waste material, extreme temperatures and pressures may be used, if required, to form the supercritical fluids. These gases typically include, but are not limited to: (1) hydrocarbons, such as methane, ethane, propane, butane, pentane, hexane, ethylene, and propylene; (2) halogenated hydrocarbons such as tetrafluoromethane, chlorodifluoromethane, sulfur hexafluoride, and perfluoropropane; (3) inorganics such as carbon dioxide, ammonia, helium, krypton, argon, xenon, and nitrous oxide; and (4) mixtures thereof. The term "dense phase gas" as used herein is intended to include mixtures of such dense phase gases. The dense phase gas selected to remove a particular contaminant is chosen to have a solubility chemistry which is similar to that of the targeted contaminant. For example, if hydrogen bonding makes a significant contribution to the internal cohesive energy content, or stability, of a contaminant, the chosen dense phase gas must possess at least moderate hydrogen bonding ability in order for solvation to occur. In some cases, a mixture of two or more dense phase gases may be formulated in order to have the desired solvent properties, as discussed hereinbelow with regard to an alternative embodiment of this invention. The selected dense phase gas must also be compatible with the substrate being cleaned, and preferably has a low cost and high health and safety ratings. Further, it is preferred that the selected dense phase gas not dissociate when exposed to the selected radiation used in the present process, or if it does dissociate, it forms products which are useful and desired in the present process, as described hereinbelow. In particular, organic gases such as freon and hexane are not desirable as the major dense phase gas for the present invention although they may be used in small quantities to produce desired radicals as described hereinbelow.

Carbon dioxide is a preferred dense phase gas for use in practising the present invention since it is inexpensive and non toxic. The critical temperature of carbon dioxide is 305° Kelvin (32° C.) and the critical pressure is 72.9 atmospheres (75 kilograms per square centimeter, $Kg/cm^2$). At pressures above the critical point, the phase of the carbon dioxide can be shifted between the liquid phase and supercritical fluid phase by varying the temperature above or below the critical temperature of 305 Kelvin (K).

Liquids which are suitable for practising the present process include, for example, ultrapure water (i.e., having a resistance of greater than 10 megohms-cm), and optionally may have a selected gas, such as oxygen or carbon dioxide dissolved therein. Ultrapure water having dissolved dense gas therein is also suitable for use as the dense fluid of the present invention. The pressure of the gas in the water is preferably between about 72.9 and 250 atmospheres (75 and 258 $Kg/cm^2$). As an example, carbon dioxide compressed to 75 atmospheres (77 $Kg/cm^2$) at 35° C. (308K) over the water produces a two phase cleaning system. The phases may be liquid carbon dioxide/water or supercritical carbon dioxide/water, depending on whether the temperature is, respectively, below or above the critical temperature of carbon dioxide.

The radiation used in practising the present process is selected to produce the dissociation of the undesired material or contaminant. The preferred radiation comprises ultraviolet (UV) radiation within the range of 184 to 300 nm. Such radiation is produced by commercially available mercury or xenon lamps. Preferred wavelengths within this range are about 184.9 and 253.7 nm. High energy pulsed radiation can be used if desired provided that it is suitable for cleaving contaminant bonds. In some cases, the radiation may alter the molecular structure and properties of the dense fluid so as to enhance its cleaning ability. For example, photoexcited dense phase ozone is expected to be highly energetic. In addition, spectroscopic evidence indicates that dense phase carbon dioxide is non-linear and hence polar during photoexcitation.

In accordance with the present process, the radiation produces bond scission or dissociation of the contaminant on the substrate as previously described. However, the simultaneous use of a dense fluid with this radiation produces an unexpected improvement in the effectiveness of the cleaning process. The dense fluid is believed to enhance the radiation propagation to thereby increase surface cleaning of the substrate. Preferably, the refractive index of the dense fluid or media should be similar or equal to that of the substrate to thereby eliminate reflection of radiation at the substrate/dense fluid interface. This matching of refractive indexes increases radiation intensity at the surface of the substrate and enhances contaminant removal, Further, it is believed that the internal reflection provided by dense fluids causes the radiation to be more effectively transmitted into holes, cracks, crevices and other surfaces not in direct line of sight with the radiation source. Accordingly, the radiation is scattered throughout the cleaning vessel exposing all substrate surfaces. This phenomenon decreases dependence of substrate distance from the radiation source for effective surface cleaning.

In addition, the dense fluid used in the present invention is not degraded by exposure to UV light and thus serves as an effective UV transmission medium and waste carrier medium. The dense fluid bathes the substrate surface and dissolves or suspends the contaminants for subsequent photolytic dissociation or physical or chemical separation. Further, the dense fluid suspends and transports the products of photolysis and thus prevents surface char formation which would reduce exposure of the substrate surface to additional radiation. Finally, dense phase gases are excellent solvents, and their low viscosity and variable solvent power make them ideal transport media. Contaminants in porous media can be removed from the pores and then once outside the pores can be removed physically. Thus, the present process simultaneously provides both the precleaning step and the precision cleaning step which have been performed in separate steps in prior art processes as previously discussed. Further, dense fluids provide better control of cleaning environment parameters than conventional liquid cleaning agents. In aqueous fluids used in the conventional methods, temperature, pH, and conductivity are controlled; whereas in the supercritical fluids used in the present process, temperature and pressure are controlled. By controlling these latter parameters, the solvent power of the fluid can be matched with the contaminant to thereby increase the cleaning power. Moreover, the present process requires shorter treatment time in order to clean the substrate as compared to conventional cleaning processes. During the photolysis of the present invention, larger organic molecules are cleaved into smaller fragments which are easier to solvate or suspend than larger molecules. This increased contaminant solvation or suspension in dense fluids decreases surface cleaning time. In addition, in the present process, photodegradation of contaminants takes place in fluid phase rather than on a solid surface.

In an alternative embodiment of the present invention, a dense phase gas oxidant is additionally used in order to enhance the removal of the undesired material. As is known in the art, an oxidizing gas enhances the photodegradation of contaminants. However, in accordance with the present process, dense phase oxidants are used. Unlike conventional oxidant enhancement agents, such as ozone, dense phase oxidants exhibit both liquid like and gas like properties. For example, at a temperature of 25° C. and a pressure of 100 atmospheres (103 Kg/cm$^2$), ozone exists as a supercritical fluid. Supercritical ozone (that is, ozone in a supercritical state) dissolved in liquid or supercritical carbon dioxide or water, is an excellent solvent/oxidant for inorganic material. The low surface tension, low viscosity, and high oxidation potential of supercritical ozone dissolved as noted make it an excellent penetrating oxidant and etchant. Other conventional oxidizing gases which have been used in ultraviolet or photochemical cleaning processes may be used in the present process. Ozone is the preferred oxidizing fluid for use in the present process. Oxygen may be provided as a precursor which is converted to ozone upon exposure to UV radiation. The ozone may be produced in the cleaning chamber or introduced into the cleaning chamber from an external source. In the former case, by precise control of the amount of oxygen dissolved in the dense fluid, the amount of ozone, produced may be directly controlled using in situ UV photolysis. In addition, other dense fluids which react with the contaminants to aid their removal may be used in the present process. One particularly useful material is hydrogen peroxide, which can be photodissociated to hydroxyl radicals and peroxide radicals, which react with contaminants and form innocuous carbon dioxide and water by-products. The hydroxyl radicals and/or peroxide radicals may be formed in situ or introduced from an external source. Adequate safety precautions must, of course, be taken when using peroxide materials. Further, fluorine gas, which can be photodissociated to form fluorine, or other dissociable halogen-containing compounds may be used. Hydrogen gas or ammonia, which can be photodissociated to form hydrogen species, may also be used. The photodissociated species have increased reactivity with the contaminant and enhance its removal or destruction. Using these reactive dense fluids, contaminants in porous media can be removed either chemically or oxidatively. Once outside the pores, the contaminants can be removed either chemically by the reactive dense fluid or by physical transport by the dense fluid.

The oxidizing or chemically reactive dense fluid may be introduced into the reaction chamber in a mixture with the main dense fluid used in the present process. Optionally, the reactive dense fluid may be introduced into the reaction chamber by a carrier, such as argon or xenon, which is stable in the presence of radiation.

Contaminant materials which may be removed from substrates in accordance with the present invention include, but are not limited to, oil, grease, lubricants, solder flux residues, photoresist, particulates comprising inorganic or organic materials, adhesive residues, plasticizers, unreacted monomers, dyes, or dielectric fluids. Inorganic and organic contaminants can be removed simultaneously in accordance with the present process. Organic contaminants absorb ultraviolet radiation causing bond cleavage. Inorganic materials are removed through solvation or fluidation in the dense media.

Typical substrates from which contaminants may be removed by the present process include, but are not limited to, substrates formed of metal, carbon, rubber, plastic, cotton, cellulose, ceramics, and other organic or inorganic compounds. The substrates may have simple or complex configurations and may include interstitial spaces which are difficult to clean by other known methods. In addition, the substrate may be in the form of particulate matter or other finely divided material, such as charcoal. Finally, the substrate may comprise water or other liquid carrier for waste materials.

In accordance with a first embodiment of the present invention, the undesired material which is removed comprises a contaminant, such as a hydrocarbon material, on the surface of a substrate, such as an integrated circuit, or a combination of ionic, inorganic and organic contaminants on the surface of a printed wiring board. In accordance with a second embodiment of the present invention, the undesired material which is removed comprises the surface layer of the substrate. Thus, the substrate surface is etched prior to further surface treatment such as metal deposition or bonding. This etching process is uniform since the contaminant abrasion produced by fluid shear forces continually removes ultraviolet char products, exposing buried contaminants. In accordance with a third embodiment of the present invention, the undesired material which is removed comprises suspended or dissolved organic contaminants and the substrate (i.e., the suspension medium) comprises a liquid, such as water, waste water, or a dense fluid. Thus, water which has been polluted with organic materials may be decontaminated by the process of the present invention. The ultraviolet radiation used in the present process dissociates the contaminants and thus removes them by destroying them. In this manner, toxic contaminants can be destroyed and the waste material can be detoxified, which significantly simplifies the disposal of such material.

FIG. 1 is a schematic representation of a system for practicing a preferred exemplary process of the present invention in which the dense fluid comprises a compressed gas. The system includes a vessel 10 in which a substrate 12. is positioned for cleaning on a holding device, such as a shelf (not shown). A mercury vapor lamp or xenon flash lamp 14 is positioned outside the cleaning vessel 10. A focusing barrel 16 and high pressure quartz window 18 are provided to allow introduction of UV radiation into the cleaning zone 20 defined by the vessel 10. A power supply 22 is provided for energizing the mercury lamp 14. The dense fluid in the form of a pressurized dense gas is pumped into the cleaning zone 20 through conduit 24. The dense gas is formed by known methods of controlling temperature and pressure. For this purpose, the cleaning vessel 10 is provided with a heating/cooling jacket (not shown) and conduit 24 is provided with a pressure control valve (not shown) In this embodiment, line 26 is omitted The dense fluid containing dissolved and entrained contaminant by-products is removed from the cleaning zone 20 through exhaust line 28.

In accordance with an alternative embodiment of the present invention, as previously discussed, a dense phase oxidant or other reactive agent is used to enhance the removal of the undesired material. The system of FIG. 1 may be adapted for use in this alternative embodiment by incorporating inlet line 26 through which the dense phase oxidant, with or without a carrier gas, is introduced under pressure into the cleaning zone 20. Alternatively, the dense phase oxidant may be mixed with the major dense phase gas used in the present process and the mixture is then introduced under pressure through conduit 24 into the cleaning vessel 10. In the latter case, inlet line 26 is omitted. The dense phase oxidant may comprise, for example, a mixture of carbon dioxide and ozone or a mixture of carbon dioxide and a predetermined amount of oxygen. In the latter case, when the mixture is exposed to radiation at 184 nanometers in the cleaning vessel, under dense fluid conditions, dense phase ozone is produced.

As previously discussed, the use of ozone in combination with ultraviolet radiation improves contaminant photodegradation and material surface properties. Accordingly, the amount of oxygen or ozone introduced into cleaning zone 20 should be precisely controlled. Preferably, oxygen mixed with carbon dioxide, xenon, or krypton is compressed to the dense fluid state in the cleaning zone 20 in which the UV radiation converts the dense phase oxygen to dense phase ozone. Alternately, ozone rather than oxygen may be mixed with the above-noted carrier gas. Dense phase ozone in the dense phase gas is more homogeneous and increases solution contact with crevices and holes in the substrate more effectively than conventional air contact techniques.

A typical cleaning process using the system set forth in FIG. 1 involves placing the substrate in the cleaning chamber and then filling the chamber with the desired dense fluid. If an oxidant or other reactive agent is used, it is introduced into the cleaning zone or produced in situ as previously described. The substrate is then subjected to ultraviolet radiation which is transmitted through the dense fluid to the substrate. After an appropriate exposure time, the ultraviolet radiation is turned off, and cleaning utilizing the dense fluid is either continued or terminated. The substrate is then removed from the cleaning zone, dried if necessary and packaged. The contaminated dense fluid may be regenerated by known means and recycled for use in the above-described system. For example, the partially decomposed contaminants may be separated by treating the dense fluid with activated carbon, or the pressure of the dense fluid may be reduced below its critical pressure and the resulting gas may be passed over activated carbon or a molecular sieve. Optionally, in a continuous process, the dense fluid containing the contaminants may be removed from the cleaning vessel and replaced with an equal amount of clean (i e., unexposed) dense fluid.

The process of the present invention may also be used to regenerate spent activated carbon. The system of FIG. 1 is used as described above, using dense phase carbon dioxide and an ozone oxidant. The spent carbon is the contaminated substrate 12. In this process, contaminants are desorbed from the carbon surfaces through physical/chemical separation and are simultaneously destroyed using dense photochemical oxidants/fluids (e.g. supercritical ozone). In addition, surface adsorbed species are destroyed before they are desorbed. Thus, hazardous waste by products are destroyed. Some of the carbon is destroyed in this process, but it is only minimal (less than 1%). Typical contaminants which may be removed from carbon by the present process include soaps, gasoline, pesticides, hydrocarbons, hydrocarbon gases, and polychlorinated biphenyls.

FIG. 2 is a schematic representation of a system for practising an alternative embodiment of the present invention in which the substrate comprises industrial waste material containing organic contaminants. The waste material may be in the form of a slurry containing solid contaminants or a liquid containing dissolved contaminants. The system includes a vessel 30, such as a high pressure stainless steel vessel, which defines a cleaning zone 32. The vessel 30 is provided with a heating/cooling jacket (not shown) in order to control the temperature in the vessel 30 to provide the required conditions for the dense phase gas. The waste material is introduced into vessel 30 through inlet pipe 34. Ultraviolet radiation means 36 produces ultraviolet radiation which is introduced into the reaction zone 32 by means of a quartz light pipe array which extends into the waste material 40 within the reaction zone 32. A two axis impeller/mixer 42 provides for effective circulation of the waste material being treated. If the waste material comprises a slurry, the mixer also maintains the particulate matter in suspension so that contact with the dense fluid and ultraviolet light can be optimized. This mixing may be augmented with an ultrasonic pulse, for example, at 400 watts/cm, such as produced by a titanium transducer obtained from B. Braun, Biotech, Incorporated in Bethlehem, Penna. If an oxidizing or other reactive agent is used, it is introduced into the reaction zone 32 through inlet pipe 44 or produced in situ as previously described. Inlet pipe 44 is provided with a pressure control value (not shown) in order to control the pressure in the vessel 30 to provide the required conditions for the dense phase gas. Treated waste material is removed through outlet pipe 48. Sampling port 50 is provided in order to take samples of the waste material as it is being treated to determine the extent of decontamination achieved. The system of FIG. 2 is used in essentially the same manner as the system of FIG. 1.

The system of FIG. 2 may also be used to clean a contaminated substrate, such as an integrated circuit. The substrate is positioned in the cleaning zone 20 on a shelf and is surrounded by the dense fluid, such as carbon dioxide and water, optionally with a chosen reactive agent.

A study was performed in which the process of the present invention was compared to the conventional ultraviolet/ozone cleaning and conventional dense fluid cleaning previously described. Four polyimide printed wiring board samples were exposed to each of the various processes. The first polyimide printed wiring board was used as a control specimen No processing or cleaning was carried out. The sample was not contaminated with acid flux or exposed to ultraviolet radiation. A second printed wiring board was contaminated with an acid flux. The board received no ultraviolet radiation exposure but was soaked for twenty minutes in deionized water at a flow rate of 150 milliliters per minute (i e., dense liquid treatment only). A third printed wiring board was contaminated with an acid flux and cleaned using a conventional ultraviolet/ozone cleaning system obtained from UVP Inc. of San Gabriel, Calif. The printed wiring board was placed 0.5 inches from the ultraviolet source for twenty minutes The fourth printed wiring board was contaminated with an acid flux and cleaned using a system as shown in FIG. 1. The dense fluid was ultrapure water The temperature of the dense fluid in the cleaning zone was maintained at about 40° C. The printed wiring board was held one inch from the ultraviolet lamp.

All four of the printed wiring boards were viewed at 100 power magnification. A visual comparison of the four printed wiring boards showed that the board treated in accordance with the present invention was cleaned to the nearly original state of the control specimen whereas neither the UV radiation cleaning nor conventional solvent cleaning was effective in removing the contamination. A graphic representation of the results of this comparison study is shown in FIG. 3. The graph demonstrates the synergistic effect of combining ultraviolet radiation cleaning with dense fluid cleaning in accordance with the present invention (Line C). Such a combination provides effective cleaning of flux contaminated printed wiring boards while dense fluid cleaning (Line A) or ultraviolet radiation cleaning (Line B) alone was not effective. The use of other dense fluids in place of water in the above described process will provide even greater cleaning effectiveness.

Thus, it can be seen that the present invention provides an improved method for removing contaminants from substrates to increased levels of cleanliness. This process simultaneously accomplishes precleaning and precision cleaning steps and removes both organic and inorganic contaminants. The present process also has the practical advantages of reducing processing time and costs, and reducing environmental impact by the regeneration of the operating dense fluids and the lack of organic solvents.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A process for removing undesired material from a chosen liquid substrate comprising the steps of:
   a) placing said liquid substrate containing said undesired material in a cleaning vessel;
   b) contacting said liquid substrate containing said undesired material with a chosen dense phase gas above the critical pressure and critical temperature of said gas, said gas being capable of producing a cleaning effect to assist in the removal of said undesired material from said substrate; and
   c) exposing said substrate and said dense phase gas to radiation of a predetermined wavelength to produce a photochemical reaction that removes said undesired material from said liquid substrate wherein said dense phase gas enhances the removal of said undesired material from said substrate.

2. A process as set forth in claim 1 wherein said radiation comprises ultraviolet radiation within the range of 184 to 300 nanometers.

3. A process as set forth in claim 1 wherein said dense phase gas is selected from the group consisting of carbon dioxide, nitrous oxide, krypton, xenon, and oxygen.

4. A process as set forth in claim 1 wherein step "b" further comprises contacting said substrate with a chosen reactive agent capable of reacting with said undesired material to thereby enhance the removal of said undesired material.

5. A process as set forth in claim 4 wherein said chosen reactive agent is selected from the group consisting of an oxygen containing compound, a halogen containing compound, and a hydrogen-containing compound.

6. A process as set forth in claim 5 wherein said chosen reactive agent is selected from the group consisting of oxygen, ozone, and hydrogen peroxide.

7. A process as set forth in claim 6 wherein said chosen reactive agent comprises ozone in a supercritical state.

8. A process as set forth in claim 1 wherein said undesired material is selected from the group consisting of an organic material, an inorganic material, and an ionic material.

9. A process as set forth in claim 1 further comprising after step "c" removing said dense phase gas containing said undesired material from said cleaning vessel and adding clean dense phase gas to said cleaning vessel.

10. A process as set forth in claim 1 wherein said undesired material comprises contaminants dissolved in said liquid.

11. A process as set forth in claim 10 wherein said contaminants comprise toxic materials and said contaminants are removed from said substrate by being chemically altered to non-toxic materials.

12. A process as set forth in claim 1 wherein said undesired material comprises contaminants suspended in said liquid.

13. A process as set forth in claim 12 wherein said contaminants comprise toxic materials and said contaminants are removed from said substrate by being chemically altered to non-toxic materials.

* * * * *